US005710444A

United States Patent [19]
Neubrand et al.

[11] Patent Number: 5,710,444
[45] Date of Patent: Jan. 20, 1998

[54] INSULATED GATE BIPOLAR TRANSISTOR HAVING A COUPLING ELEMENT

[75] Inventors: Horst Neubrand, Frankfurt; Jacek Korec, Mörfelden-Walldorf; Dieter Silber, Obertshausen, all of Germany

[73] Assignee: Daimler-Benz Aktiengesellschaft, Stuttgart, Germany

[21] Appl. No.: 448,505

[22] PCT Filed: Dec. 24, 1993

[86] PCT No.: PCT/EP93/03688

§ 371 Date: Jun. 8, 1995

§ 102(e) Date: Jun. 8, 1995

[87] PCT Pub. No.: WO94/15365

PCT Pub. Date: Jul. 7, 1994

[30] Foreign Application Priority Data

Dec. 28, 1992 [DE] Germany ............... 42 44 272.9

[51] Int. Cl.[6] ............... H01L 29/72; H01L 29/10
[52] U.S. Cl. ............... 257/140; 257/141; 257/146; 257/152; 257/161; 257/162
[58] Field of Search ............... 257/139–141, 257/144, 146, 147, 152, 161, 162

[56] References Cited

U.S. PATENT DOCUMENTS

| | | | |
|---|---|---|---|
| 4,072,975 | 2/1978 | Ishitani | 357/23 |
| 4,682,195 | 7/1987 | Yilmaz | 357/23.4 |
| 4,694,313 | 9/1987 | Beasom | 357/23.4 |
| 5,497,011 | 3/1996 | Terashima | 257/133 |

FOREIGN PATENT DOCUMENTS

| | | |
|---|---|---|
| 0080044 | 6/1983 | European Pat. Off. . |
| 0267447 | 5/1988 | European Pat. Off. . |

(List continued on next page.)

OTHER PUBLICATIONS

D.N. Pattanayak et al.: "n-Channel Lateral Insulated Gate Transistors: Part I—Steady-State Characteristics" In: IEEE Trans. on El. Dev., vol. ED-33, No. 12, Dec. 1986, pp. 1956–1963.

M. Darwish et al.: "Lateral Resurfed Comfet". In: Electronics Letters, vol. 20, No. 12, Jun. 7, 1984, pp. 519–520.

B.J. Baliga et al.: "Dielectrically Isolated Lateral Emitter Switched Thyristor". In: Electronics Letters, vol. 28, No. 22, Oct. 22, 1992, pp. 2051–2052.

J.K.O. Sin: "Lateral Insulated-Gate Bipolar Transistor (LIGBT) with a Segmented Anode Structure". In: IEEE El. Dev. Letters, vol. 12, No. 2, Feb. 1991, pp. 45–47.

D.J. Samuels et al.: "Guard-Ring Schottky Clamp for a Polysilicon Process". In: IBM Techn. Discl. Bulletin, vol. 25, No. 2, Jul. 1982, p. 590.

*Primary Examiner*—Peter Toby Brown
*Attorney, Agent, or Firm*—Spencer & Frank

[57] ABSTRACT

The invention concerns a field-effect controlled semiconductor component with at least four regions of alternating opposite performance types: an anode-side emitter region, a first and a second base region connected to the emitter region, and a cathode-side emitter region; the cathode-side emitter region and the first base region from the source and drain of an MOS field effect transistor. The component also comprises an anode contact, a contact at the cathode-side emitter region and a control electrode contact of the MOS field effect transistor. The invention lies in the fact that a p+ region (36) which is adjacent to the cathode-side base region, separate, and accomodated in the anode-side n− base region (20), is connected via a separate component as a coupling element (80) with non-linear current/voltage characteristics to the cathode contact, the said region (36) being directly surrounded by the anode-side base region (20). When the field effect transistor is switched off the electrical potential in the area surrounding the supplementary p+ region (36) will exceed the threshold voltage of the coupling element, so that the supplementary p+ region (36) acts as a current sink by which the hole current can drain off against low resistance. A parasitic thyristor function is thus avoided.

5 Claims, 2 Drawing Sheets

FOREIGN PATENT DOCUMENTS

| | | |
|---|---|---|
| 0416805 | 3/1991 | European Pat. Off. . |
| 0434914 | 7/1991 | European Pat. Off. . |
| 0492558 | 7/1992 | European Pat. Off. . |
| 0280535 | 8/1988 | European Pat. Off. . |
| 0563952 | 10/1993 | European Pat. Off. . |
| 3435612 | 4/1986 | Germany . |
| 3804254 | 8/1989 | Germany . |
| 4228832 | 3/1994 | Germany . |
| 0332172 | 11/1992 | Japan . |
| 2173037 | 10/1986 | United Kingdom . |

INSULATED GATE BIPOLAR TRANSISTOR HAVING A COUPLING ELEMENT

This application was filed under 35 U.S.C. §371 from PCT/EP93/03688, filed Dec. 24, 1993.

BACKGROUND OF THE INVENTION

1. Field of the Invention

The invention relates to a field-effect-controlled semiconductor component having at least four regions of alternating opposite conductivity type, including an anode-end emitter region, adjoining first and second base region and a cathode-end emitter regions, with the last-mentioned emitter region and the first base region forming the source and drain of an MOS field-effect transistor, and having an anode contact, a contact at the cathode-end emitter region and a control electrode contact for the MOS field-effect transistor.

2. Background Information

Such a component is known as an insulated gate bipolar transistor (IGBT or IGT). It was described in the European Patent Application EP-B1 80 044 and in the central application DE-A1 34 35 612. The essentials of this prior art reference are illustrated in FIG. 1. For FIG. 1, a lateral embodiment on an SOI substrate (SOI=silicon on insulator layer) was selected comprising a carrier substrate 5, a buried insulator 15 and a silicon layer 21. The IGBT comprises an anode-end emitter region 10, two adjoining base regions 20 and 32, 34 and a cathode-end emitter region 40. On an insulating layer 50, which covers a portion of the cathode-end base region 34, there is disposed a control contact 60 called a gate which forms a field-effect transistor together with the cathode-end emitter 40 and the anode-end base region 20. The component is provided with two power supply connections, a cathode 72 and an anode 76.

If the IGBT is polarized in forward direction and if the gate connection 60 of the field-effect transistor is actuated with positive potential vis-a-vis cathode 72, a conductive channel 42 is formed in the cathode-end base region 34, with this channel connecting the cathode-end emitter region 40 with the anode-end base region, i.e., the first base region 20. The electron current thus caused acts as gate current for the anode-end p-n-p transistor 10, 20, 34.

The resistance of channel 42, which is controllable by the gate, determines the level of the gate current, the injection of the minority charge carrier (holes) from the anode-end emitter 10, and therewith the on-state voltage of the component. For switch-off, the gate potential is equated with the cathode-potential so that the conductive channel 42 of the field-effect transistor disappears and the load current is switched off.

In the prior art solutions, different short-circuit structures are used for the emitter connections 72 and 76 to improve the switching properties of the component. For example, anode-end short circuits have been proposed (EP-B1 80 044) to increase the switching speed. Cathode-end short circuits (DE-A1 34 35 612) are necessary for carrying off the hole current of the p-n-p transistor to the cathode contact at a low resistance.

To this end, DE-A1 42 28 832 proposed to subdivide the hitherto undivided cathode-end base region (see FIG. 1) into two partial regions 32 and 34. The partial region 34 is moderately doped and, together with the thickness of the insulating layer 50, determines the threshold voltage of the field-effect transistor 40, 42, 20. The partial region 32 is highly doped in order to keep the layer resistance of the cathode-end base region low. This ensures that the p-n junction between the cathode-end emitter 40 and the cathode-end base region 34 is not biased so heavily in the forward direction that the emitter 40 injects electrons into the base region 34. Such an electron injection, however, would result in serious drawbacks. A locking-in of the existing parasitic thyristor structure 40, 34, 20, 10 in a switched-through state would entail a loss of the effect of the gate control.

Even if the above-described short circuit of the cathode-end emitter is used, the hole current in the p-conducting base region 34 can still effect a sufficiently large voltage drop which suffices to cause an electron injection from the emitter 40 to thus ignite the parasitic thyristor structure 40, 34, 20, 10.

A particularly dangerous operating condition develops during an inductive switch-off process during which the entire load current is carried by a hole current for some time. This risk severely limits the safe operating range of the component.

A similar drawback, known from the use of MOS-controlled thyristors, was eliminated by a modification of the emitter-switched-thyristor (see DE-A1 42 28 832) in that the hole current is carried off via a base cathode coupling element having a nonlinear IU characteristic.

SUMMARY OF THE INVENTION

It is the object of the invention to modify a field-controlled semiconductor component of the generic type described in the introduction so as to expand the safe operating area (SOA) of an IGBT.

This object is solved in that a $p^+$-area which lies separately, but adjacent to the cathode-end base region and which is placed into the anode-end n-base region and is connected via a separate component as coupling element having a nonlinear current/voltage characteristic to the cathode contact.

As in the prior art solution, the IGBT is controlled through the switching of the gate potential. In the anode-end base region, a potential distribution develops in an on-state condition, with this distribution leading to the fact that the additionally placed-in $p^+$-area takes on the potential of the surrounding area and has no effect. The threshold voltage of the nonlinear coupling element must be dimensioned such that it is slightly higher than the cathode-related potential of the $p^+$-area. When the field-effect transistor is switched off, the electrical potential of the area surrounding the additional $p^+$-area will exceed the threshold voltage of the coupling element but the potential of the $p^+$-area is clamped by the threshold voltage. This results in the $p^+$-area acting as current drain, and the hole current flowing off via this path must only overcome a small dynamic resistance of the coupling element.

The solution according to the invention has special advantages for the operation of laterally configured IGBT's on SOI substrates where the load current is impressed through a thin layer and where the effect of the $p^+$-area with respect to the expansion of the SOA range is particularly pronounced.

BRIEF DESCRIPTION OF THE DRAWINGS

In the following, the invention is explained in greater detail by way of the drawing. The drawing shows.

DETAILED DESCRIPTION OF THE PREFERRED EMBODIMENT

An advisable embodiment of the coupling element comprises a monolithically integrated Zener diode polarized in reverse direction. A second preferred embodiment utilizes the existing layer of polycrystalline silicon to produce a diode chain polarized in forward direction so as to set the level of the threshold voltage.

Figure 1:
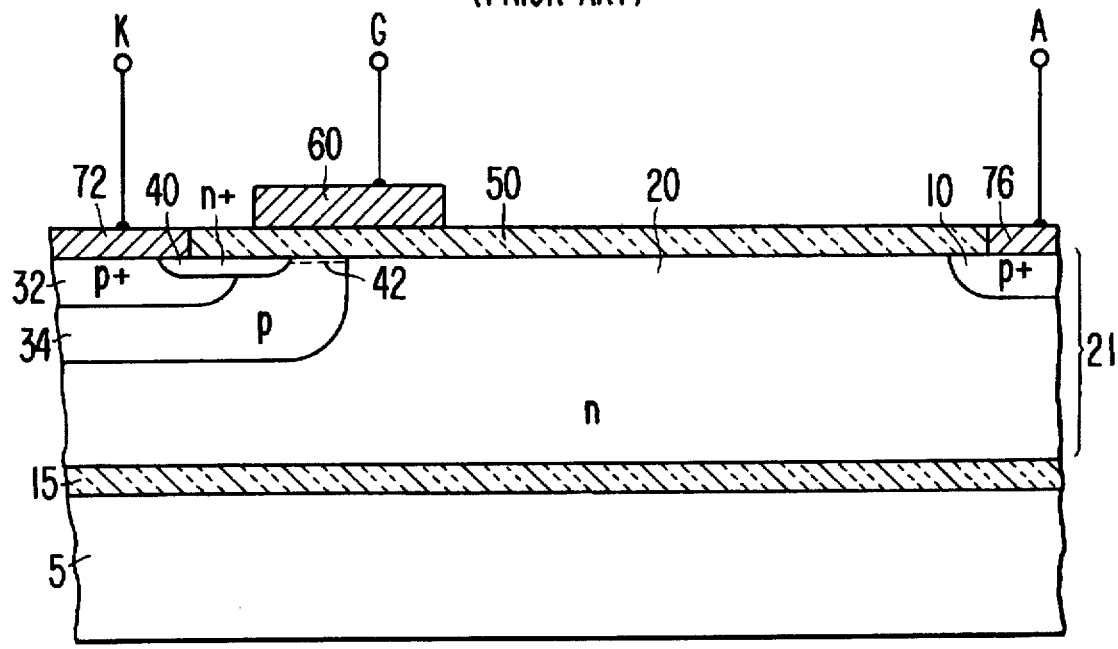
FIG. 1 is a sectional view of an IGBT semiconductor component according to the prior art.
Figure 2:
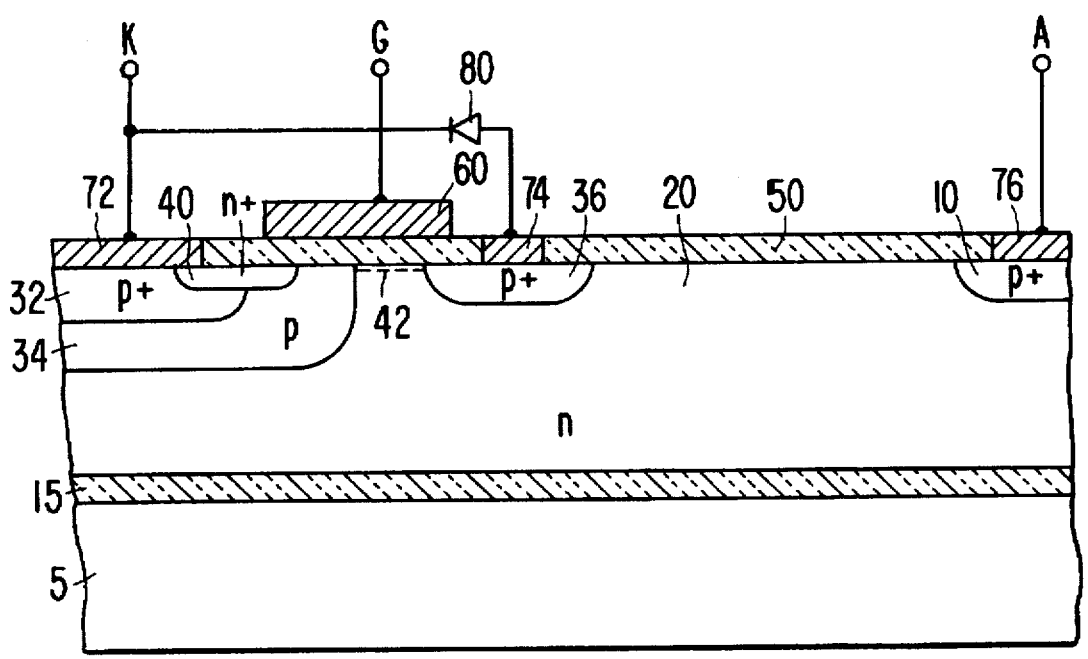
FIG. 2 is a section through an IGBT semiconductor component according to the invention.

A preferred embodiment of the component on an SOI substrate is shown in FIG. 2. The additionally placed-in $p^+$-area 36 is provided with an electrical contact 74 and via a schematically shown separate diode 80 which is linked to the cathode contact 72. This separate diode preferably comprises a monolithically integrated diode or diode chain. The diode chain preferably comprises two polysilicon diodes polarized in forward direction. This embodiment does not require any additional fabrication steps and can be implemented in the normal process sequence for fabricating an IGBT.

The semiconductor component illustrated in FIG. 2 is provided in lateral form with the highly p-doped, anode-end emitter layer 10, the first base region 20 with n-doping, the second base region with the highly p-doped partial region 32, the p-doped partial region 34 and the partial region 36 which is separated from these partial regions 32, 34 by the n-layer 20. Emitter region 40 serves as an n-doped area which extends from the cathode K to below the gate contact 60. An anode connection A having the anode contact 76 and a cathode connection K having the cathode contact 72 are also present.

The gate 60 is disposed on an insulating layer 50 extending from area 10, which is partially covered by the insulating layer, over the partial area 36 and around the recess of contact 74 and then over the n-layer of the first base region 20 and the partial region 34 up to a highly n-doped area 40 which is partially covered by the insulating layer 50.

The other part of area 40 and the partial region 32 are covered by the cathode contact 72.

Figure 3:
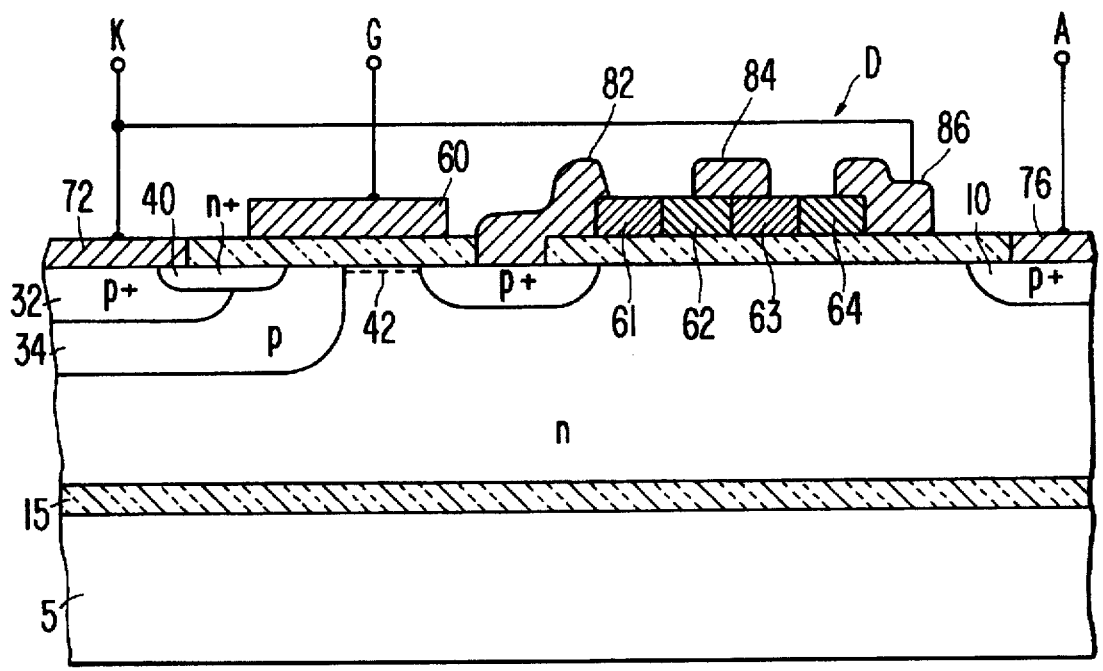
FIG. 3 is a sectional view of an IGBT semiconductor component according to the invention as shown in FIG. 2, but with a chain of diodes integrated into a layer of polycrystalline silicon for the coupling element.

The diode chain polarized in forward direction is produced by alternating $p^+$-doping and $n^+$-doping of a semiconductor layer made of polycrystalline silicon on an insulating layer and a corresponding metallization. Such a diode chain is shown in FIG. 3 wherein a diode chain D, is formed in a semiconductor layer on the insulating layer 50, of alternating highly doped p-doped and n-doped regions 61, 62, 63, 64 and corresponding metallizations 82, 84, 86. A first end of the diode chain is connected to the highly doped region 36 embedded in the first base region 20 by the corresponding metallization 82, and the other end of the diode chain is connected to the metallization 86 which in turn is connected to the cathode contact 72.

The solution according to the invention also applies to complementarily configured structures in which the n-areas and the p-areas are respectively reversed as to their type of conductivity.

What is claimed is:

1. A field-effect-controlled semiconductor component (IGBT), comprising:

a semiconductor body having at least four regions of alternating opposite conductivity types and forming respective p-n junctions between adjoining ones of said four regions, said four regions including an anode-end emitter region, said four regions adjoining first and second base regions and a cathode-end emitter region, wherein the cathode-end emitter region and the first base region form a source and a drain of an MOS field-effect transistor having a channel region formed adjacent the second base region;

an anode contact for the anode end emitter region, a cathode contact for the cathode-end emitter region and a control electrode contact for the MOS field-effect transistor and disposed on an insulating layer formed on a top surface of the semiconductor body and above the source, drain and channel regions;

an additional p-n junction realized by a separately disposed $p^+$-area which lies adjacent to the second base region and which is placed into the first region, which is an n-type conductivity region; and wherein the $p^+$-area is connected only to the cathode contact via a coupling element having a nonlinear current/voltage characteristic, with the coupling element being separated from the structure within the semiconductor body of the semiconductor component; whereby when the IGBT is switched off, a hole current flows from the anode contact to the cathode contact not only via the second base region which is a p-region, but also via the $p^+$-area and via the coupling element in order to prevent an ignition of a parasitic thyristor structure.

2. A field-effect-controlled semiconductor element according to claim 1, wherein the coupling element is a Zener diode polarized in reverse direction.

3. A field-effect-controlled semiconductor element according to claim 1, wherein the coupling element is integrated as a chain of diodes into a layer of polycrystalline silicon and is polarized in forward direction.

4. A field-effect-controlled semiconductor component according to claim 1, wherein the cathode-end emitter region is partially covered by a highly doped p-layer.

5. A field-effect-controlled semiconductor component according to claim 1, at a face facing away from a top side of the semiconductor body, the first base region rests entirely on an insulating layer.

* * * * *